United States Patent [19]

McCready et al.

[11] 4,019,098

[45] Apr. 19, 1977

[54] HEAT PIPE COOLING SYSTEM FOR ELECTRONIC DEVICES

[75] Inventors: Raymond George McCready, South Bend, Ind.; Philip Eugene Eggers, Worthington, Ohio

[73] Assignee: Sundstrand Corporation, Rockford, Ill.

[22] Filed: June 6, 1975

[21] Appl. No.: 584,313

Related U.S. Application Data

[62] Division of Ser. No. 526,643, Nov. 25, 1974.

[52] U.S. Cl. .............................. 361/385; 165/80; 174/15 HP
[51] Int. Cl.² ............................................ H05K 7/20
[58] Field of Search ............ 165/80, 105; 317/100; 174/15 HP

[56] References Cited

UNITED STATES PATENTS

| | | | |
|---|---|---|---|
| 3,429,122 | 2/1969 | Pravda | 165/105 |
| 3,480,837 | 11/1969 | Feldmann | 317/100 |
| 3,482,198 | 12/1969 | Hopper, Jr. | 317/100 |
| 3,528,494 | 9/1970 | Levedahl | 165/105 |
| 3,613,778 | 10/1971 | Feldman, Jr. | 165/105 |
| 3,651,865 | 3/1972 | Feldmanis | 317/100 |
| 3,680,189 | 8/1972 | Noren | 165/105 |
| 3,803,688 | 4/1974 | Peck | 165/105 |

Primary Examiner—Gerald P. Tolin
Attorney, Agent, or Firm—Ted E. Killingsworth; Michael B. McMurry

[57] ABSTRACT

In order to remove heat from integrated circuit modules a layered aluminum heat transfer structure is secured to the upper portion of a circuit board. The heat transfer structure includes a number of heat pipes for transferring heat to a condenser region. Each heat pipe is composed of a central vapor channel with a number of parallel capillary channels, each of which is open on one side to the vapor channel thereby serving as the wick of the heat pipe, running the length of the circuit board to a condenser region. There is one heat pipe for each low of integrated circuit modules wherein the modules are placed on the upper portion of the heat transfer structure and secured by means of terminal pins that run through the structure to the circuit board. The heat from the circuit modules vaporizes a working fluid in the capillaries and the vapor, in turn, travels in the vapor channel to a condenser region to be cooled and condensed by a cooling medium over this region.

11 Claims, 5 Drawing Figures

HEAT PIPE COOLING SYSTEM FOR ELECTRONIC DEVICES

CROSS-REFERENCE TO RELATED APPLICATIONS

This application is a division of the copending application Ser. No. 526,643, filed Nov. 25, 1974, entitled "Heat Pipe Cooling System for Electronic Devices."

BACKGROUND OF THE INVENTION

This invention relates to the field of cooling systems for electronic components and, more particularly, to the use of heat pipes to cool electronic circuit board components.

In many electronic systems, such as large scale digital computers, the efficient cooling of electronic components is becoming an increasing problem. With the advent of large scale integrated circuit modules containing many thousands of transistors, it has become possible to pack vast numbers of electronic components together within a very small area. However, these integrated circuit modules, during the course of their normal operation, generate significant amounts of heat. Since most solid state devices are sensitive to excessive heat, the generation of heat by the large scale IC's in close proximity to one another has become of increasing concern to industry. A typical approach to cooling components in digitial computer systems, where the modules containing integrated circuits are placed on circuit boards, is to direct a stream of cooling air across the modules and the boards. One of the principal disadvantages of this approach is that the air, as it passes down a row of circuit cards, progressively increases in temperature as it absorbs heat from the boards and, as a result, loses much of its ability to absorb heat from the circuit boards at the end of the row. Cooling the components by this means necessitates a number of compromises to the overall system, such as: placing the modules containing the integrated circuits farther apart on the circuit boards; increasing the distance between circuit boards; and increasing the volume and velocity of cooling air directed over those components which, of course, requires special considerations in the design of the cabinets containing the circuit boards and the mechanical systems for delivering the air.

With increasing emphasis on high speed operation in electronic systems such as digital computers, it has become increasingly desirable to place the electronic components physically as close as possible to one another. In addition to facilitating the packaging and the structure of the overall system, close placement of the integrated circuit modules, especially in high speed digital computers, is highly desirable due to significant propagation delays in electronic signals resulting from the physical separation of the modules. In addition, in order to get the various electronic components in an integrated circuit to operate at higher speeds, it is necessary to apply more power to the components which, in turn, means that more heat is generated. The problem of removing the heat generated by the integrated circuits has led to compromises with respect to the design speed of various types of electronic equipment.

SUMMARY OF THE INVENTION

It is therefore an object of the invention to provide a means of cooling electronic components on a circuit board so as to minimize the distance between components on the circuit boards and to reduce the spacing between boards.

It is an additional object of the invention to provide a means of increasing the rate of heat transfer from electronic components with a system having a minimum of moving parts.

It is a further object of the invention to apply the concept of a heat pipe to the cooling of electronic components in a circuit board environment.

Another object of the invention is to provide a heat pipe, with capillary channels forming the wick of the heat pipe and which are open to a vapor channel along the entire length of the wick, so as to make possible essentially uniform heat removal from a row of electronic components.

An additional object of the invention is to provide a cooling system of increased efficiency for electronic components wherein a cooling structure that includes heat pipes are interposed between a circuit board and the electronic components.

For purposes of this disclosure, the heat pipe arrangement for cooling electronic components will be described in terms of a typical digital computer circuit board which accommodates a 15 × 20 array of integrated circuit modules. Such boards are commonly found in large scale digital computers and are stacked in rows within the computer's cabinets.

The invention utilizes a heat transfer structure composed of three layers of aluminum secured to the upper side of the circuit board in a manner forming a heat pipe for each row of integrated circuit modules. The integrated circuit modules, instead of being secured directly to the circuit board, as in the prior art, are placed on the upper layer of this structure. The layered structure contains heat pipes that run parallel to, and directly underneath each row of circuit modules to a condenser region of the structure. The heat pipes themselves consist of a vapor channel formed in the middle layer of the structure and a wick comprised of capillary channels formed or extruded out in the upper and lower layers as by extrusion. Thus, each heat pipe consists of a central vapor channel running the length of the circuit board with capillary channels open to the vapor channels along the length of the vapor channel. A description of a related type of heat pipe and its operation is provided in the U.S. Pat. No. 3,786,861 to Eggers.

In addition, the heat transfer structure is configured with a plurality of slots through which terminal pins extend upwardly from the circuit board. The upper portions of the terminal pins serve the circuit modules to the upper portion of the structure and to provide electrical contacts to the circuit board. The heat transfer structure, including the heat pipe portion, is preferably fabricated out of aluminum sheets due to the excellent heat transfer characteristics and the workability of aluminum.

In normal operation, the working fluid moves from the condensing region, beneath a row of circuit modules, in the capillary channels of the heat pipe. As heat builds up in each of the circuit modules, it will be transmitted through the upper layer of aluminum to the capillary channels where a certain proportion of the working fluid will absorb the heat and change to a vapor state. The vapor, as it is generated, enters the vapor channel through the open side of the capillary and is transported back to the condenser region of the heat pipe structure. The condenser region extends beyond the circuit board into a stream of coolant which serves to remove the heat from the working fluid and causes it to condense into a liquid state.

Since heat is removed from each individual circuit module directly by means of the heat pipe, it is therefore possible to place the circuit modules closer together. Since the heat is removed from each module individually, primarily as a function of its temperature, there will be no significant difference in the resulting temperatures of the various circuit modules with respect to their location on the circuit board or the location of the circuit board in the cabinet as in the prior art systems. A small temperature difference will, however, exist across the condenser in the direction of coolant flow. Another particular advantage of this cooling system concerns the fact that it uses a heat pipe concept which has no moving parts thereby significantly reducing the overall cost and complexity of the system.

BRIEF DESCRIPTIONS OF THE DRAWINGS

DETAILED DESCRIPTION OF THE INVENTION

Figure 1:
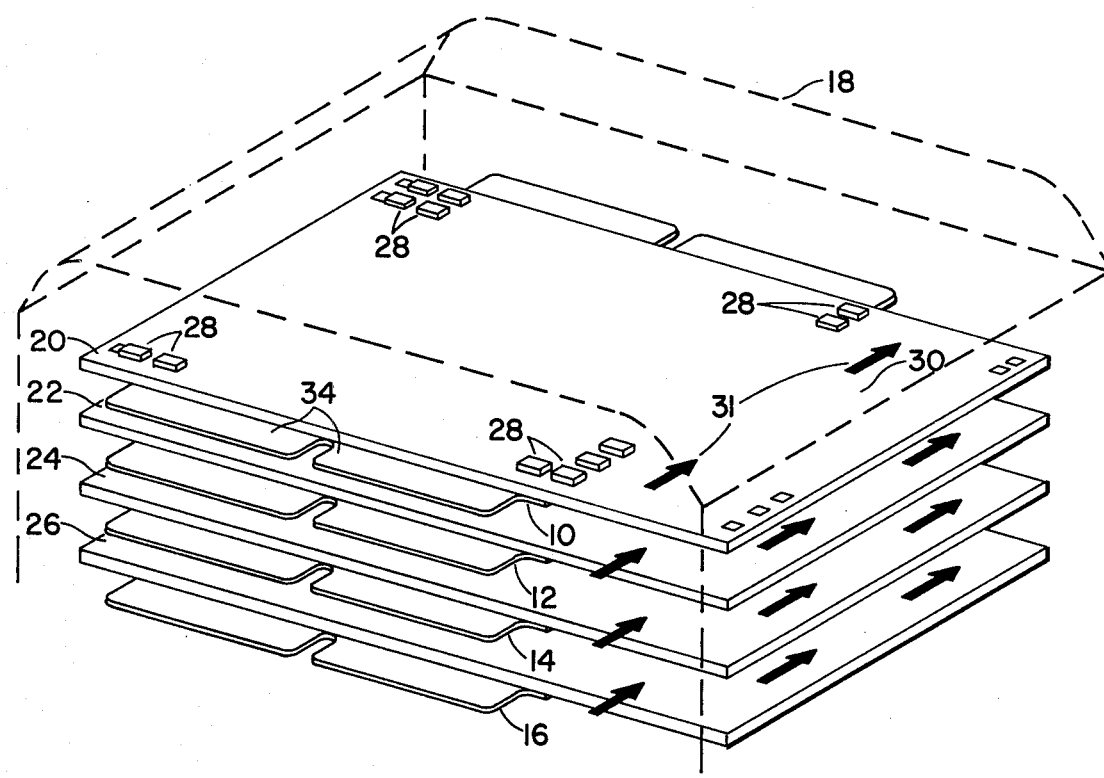
FIG. 1 is a perspective view of a plurality of circuit boards and their associated heat transfer structures in a cabinet.

In FIG. 1 is illustrated a perspective view of a group of circuit boards 10, 12, 14 and 16 as they would be typically placed in a cabinet 18 of a digital computer. Attached to the upper portion of each circuit board 10, 12, 14 and 16 is a heat transfer structure 20, 22, 24 and 26, and secured to the upper surface of the heat transfer structure, are a plurality of integrated circuit modules 28 in a 15 × 20 array. Each of the heat transfer structures has a condenser region represented, for example, by 30 of FIG. 1 for the upper heat transfer structure 20. It is across this condenser region 30 that a cooling medium such as air, as represented by the arrows 31, is directed in order to remove the heat from the heat transfer strucutre 20 and hence the integrated circuit modules 28. In addition to air, the cooling medium 31 can be a fluid or a refrigerant which is particularly facilitated due to the fact the condenser regions 30 provide localized areas that can easily be enclosed. To improve the transfer of heat from the condenser region 30, the condenser region can be configured with fins which are not shown in the drawings.

Figure 2:
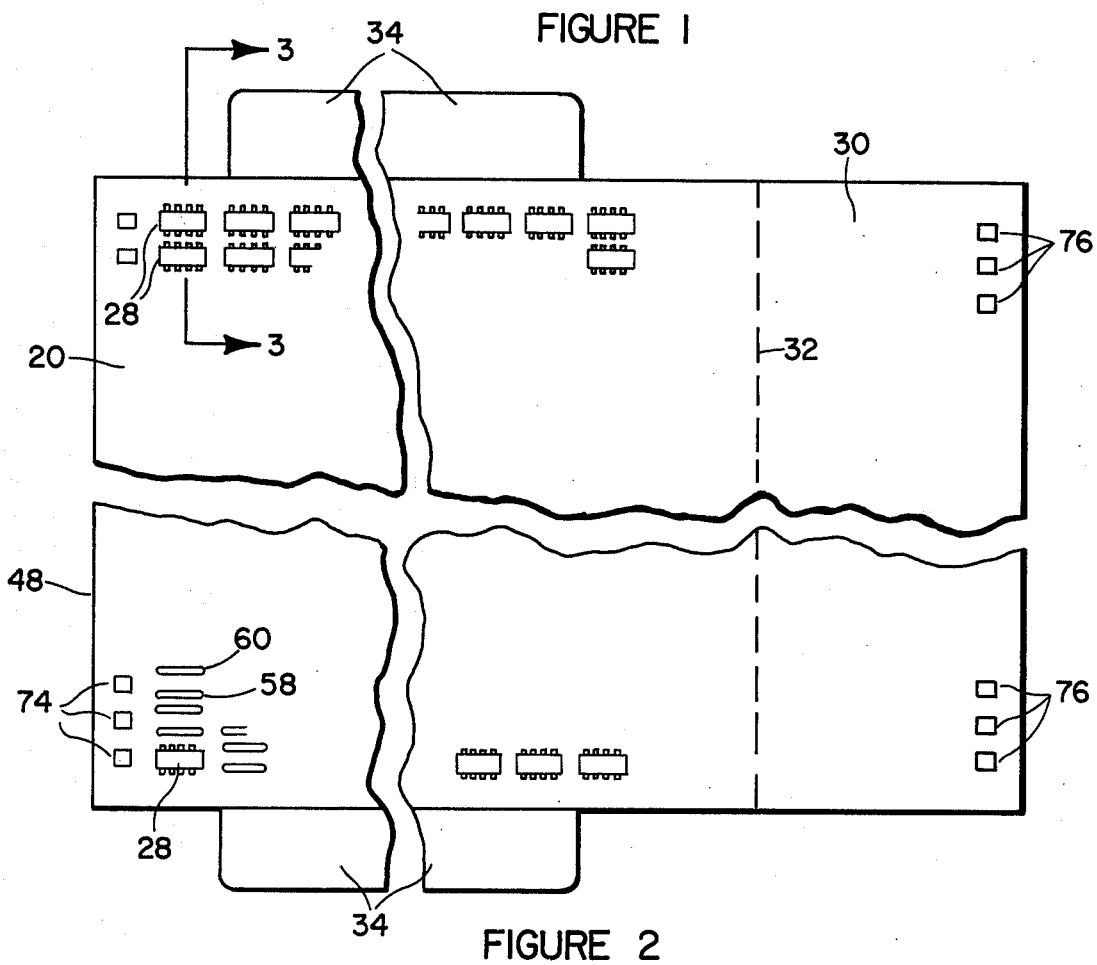
FIG. 2 is a top view of a heat transfer structure.

Referring to FIG. 2, the right hand portion of the heat exchange structure 20 is the condensing region 30, which extends past the end of the circuit board 10, as indicated by the dashed line 32 into the air stream 31. Affixed to the heat exchange structure 20 are some 300 integrated circuit modules 28 in a 15 × 20 array. In addition, FIG. 2 illustrates the circuit board connectors 34 of the circuit board 10 which extends outwardly from below the heat exchanger structure 20.

Figure 3:
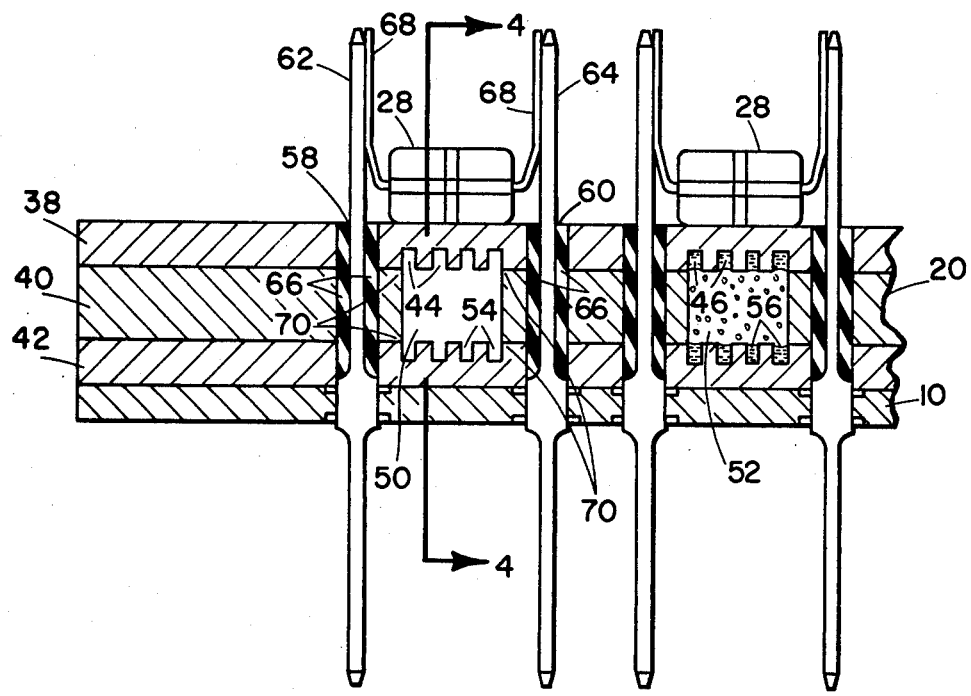
FIG. 3 is a cross section of a layered heat transfer structure and a circuit board taken at about line 3—3 of FIG. 2, showing a cross-section of two heat pipes.

FIG. 3 illustrates a cross-section of the circuit board 10 and the heat exchanger structure 20 corresponding to the section lines 3—3 of FIG. 2. In the preferred embodiment of the invention, the heat transfer structure 20 consists of three layers of aluminum 38, 40 and 42. The upper layer 38, upon which the integrated circuit modules 28 are secured, is configured on the opposite surface of a group of grooves 44 that form a series of capillary channels that serve as the wick of the heat pipe. In each of these channels 44, the working fluid, in a liquid state as shown by 46, will be flowing from the condenser region 30 to the front end 48 of the structure 20 as shown in FIG. 2. The center layer 40 of the heat transfer structure is, in the preferred embodiment, a series of aluminum spacers that are combined to form a vapor channel 50 for each row of circuit modules 28. As the working fluid 46 absorbs the heat from the circuit modules 28, it changes to the vapor state, as represented by 52, and then returns as a result of a slight pressure differential to the condenser region 30 of FIG. 1. The lower layer 42 of the heat transfer structure 20 is configured in a similar manner to the upper section 38 with capillary channels 54 opening into the vapor channel 50. Again, the working fluid in a liquid state 56, flows from the condenser region absorbing heat generated by the circuit modules 28 and changes into the vapor state 52 for movement back to the condenser region 30 through the vapor channel 50. Both the upper layer 38 and the lower layer 42 are planer aluminum sheets that can be formed by a hot extrusion process or pressure-rolled so as to include the capillary grooves 44 and 54. Utilizing planar sheets in this manner provides for significant economies in manufacture and assembly.

Associated with each integrated circuit module 28 are two slots 58 and 60 adjacent to each side of the circuit module 28. Through these slots 58 and 60 terminal pins, identified as 62 and 64, extend upwardly form the circuit board 10. Normally, there will be seven terminal pins 62 and 64 on each side of the circuit module 28 corresponding to the fourteen connector pins of a standard integrated circuit module. An insulating material 66 which, for example, may consist only of anodized surfaces, surrounds each of the terminal pins 62 and 64 in the slots 58 and 60 in order to provide electrical insulation for the terminal pins 62 and 64. The terminal pins 62 and 64 serve two functions; first, to secure the integrated circuit modules 28 to the top of the upper layer 38 by means of tension on the connector pins 68 of the circuit modules and, secondly, to provide electrical connection from the connector pins 68 to the circuit board 10. This method also allows the heat transfer structure 20 to be placed on the circuit board after the pins 62 and 64 have been placed on the board 20 and any wire wrapping that needs to be done is completed on the underside of the board 10.

At this point, it is important to note that the heat generating surface of the circuit module 28 abuts directly against the upper layer 38 in order to maximize heat transfer from the module 28 to the heat transfer structure 20. This is the reverse of most industry practices where the connector pins 68 of the circuit modules extend downwardly into the circuit board and where the heat generating surface of the circuit module extends upwardly into the air.

Also, in the preferred embodiment of the invention, the joints 70 between the upper layer 38, the middle layer 40 and the lower layer 42 of the cooling structure will be vacuum braized or resistance welded in order to hermetically seal the heat pipe.

Representative dimensions for the heat pipe in the preferred embodiment of the invention include capillary channels having a width of 0.031 inches (0.0786 cm) and a depth of 0.05 inches (0.127 cm). These dimensions will be effective to maintain the working fluid, in a liquid state, inside the channels by purely capillary action or surface tension. The vapor channel 50, in the preferred embodiment has the dimensions of 0.193 inches (0.480 cm) in width with a height of 0.13 inches (0.330 cm). The heat transfer structure 20 will have a thickness on the order of 0.312 inches (0.792 cm). These dimensions will provide sufficient cross-sectional area for the vapor to transport the generated heat to the condenser region 30. Freon-11, Freon-21 and ammonia are examples of working fluids that are suitable for the operating temperature ranges, 0° to 180° F. (−20° to 80° C.), and for use within the capillary channels of the above dimensions.

Figure 4:
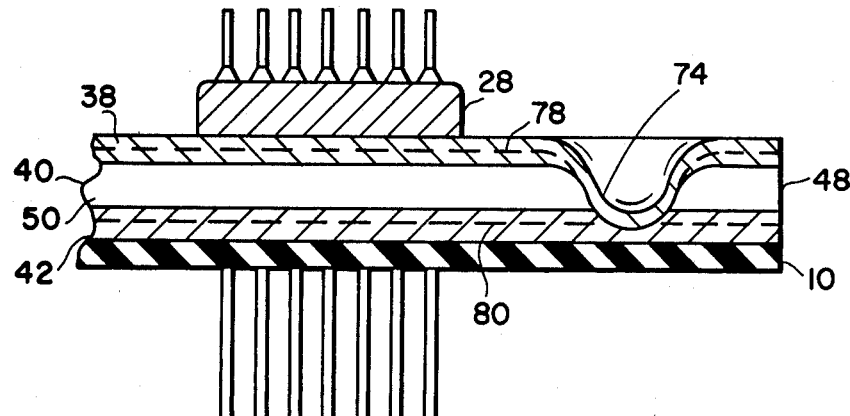
FIG. 4 is a longitudinal section of a heat pipe taken at about the line 4—4 of FIG. 3.

In FIG. 4 is illustrated a longitudinal section of the heat transfer structure 20 along the section lines 4—4 of FIG. 3. As shown in FIG. 4, the vapor channel 50 extends through the cooling structure to the front end 48 of the structure. The top of the upper capillary channel 44 is indicated by the dashed line 78 and the bottom portion of the lower capillary channel 54 is shown by the dashed line 80. In the preferred embodiment of the invention the heat pipe, which includes the vapor channel 50 and the upper and lower capillary channels 44 and 54, is crimped at 74 in order to seal the heat pipe. This crimping technique, as shown at 74, is also used to seal the heat pipes at the condenser end 30 of the cooling structure as represented by the squares 76 in FIG. 2. The crimping of each end of the heat pipes provides a quick and inexpensive method for sealing the heat pipes.

Figure 5:
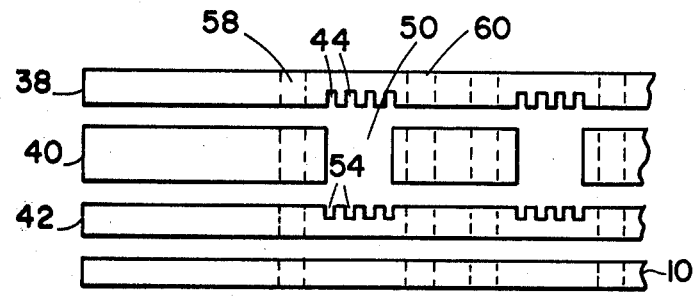
FIG. 5 is an exploded view of the front portion of a circuit board and the heat transfer structure.

For added clarity, an exploded view of the front portion 48 of the cooling structure and circuit board 10 is provided in FIG. 5. As indicated before in the preferred embodiment of the invention, the heat pipes are comprised of the vapor channel 50 and the capillary channels 44 and 54 and as such are fabricated from the top layer of extruded aluminum sheet 38, a middle layer of aluminum spacer elements 40, and lower portion 48 of extruded aluminum sheet. In addition, slots 58 and 60 are drilled, cut, formed or punched into the sheets 38, 40 and 42 and into corresponding positions in the circuit board 10.

The heat pipes are charged with the working fluid by first crimping all the heat pipes at one end of the heat transfer structure as shown by the reference numbers 74 or 76, and placing a gas-tight manifold (not shown) over the ends of the heat pipes at the other end of the heat transfer structure, for example at the front end 48. Then, as is conventional in industry, the heat pipes are "pumped-down" to remove the air and are "back-filled" with the working fluid. After filling, the heat pipes are crimped at 74 in order to hermetically seal the working fluid in the pipes. Utilizing Freon-21 as a working fluid, the heat pipes will be filled with enough liquid to fill the grooves 44 and 54, plus about 5% extra at a pressure of 25 PSI absolute.

The invention has been discussed in terms of a preferred embodiment wherein a plurality of circuit boards, each containing a 15 × 20 array of integrated circuit modules, is cooled by heat pipes aligned below each row of integrated circuit modules. It should be understood, however, that the scope of the invention is not intended to be restricted to either the precise environment described nor to the dimensions or materials set forth in this disclosure.

We claim:

1. A heat pipe structure for cooling electronic components comprising:
   a first planar sheet configured with grooves on the inner surface that form a first group of capillary channels;
   a second planar sheet configured with grooves on the inner surface that form a second group of capillary tubes;
   at least three spacer members interposed between said first and said second sheet effective to form at least two vapor channels parallel to each of said groups of capillary channels;
   a condenser region at one end of the heat pipe for transferring heat from the heat pipe to a cooling medium;
   a working fluid contained in a liquid state in said capillary channels and a vapor state in said vapor channels for transferring heat from the electronic components to said condenser region;
   a plurality of electronic components secured to the outer surface of said first sheet;
   a circuit board secured to the outer surface of said second sheet;
   a plurality of terminal pins extending through the heat pipe connecting said electronic components to said circuit board.

2. The heat pipe of claim 1 wherein said electronic components include a plurality of connector pins and wherein said terminal pins abut said connector pins thereby serving to secure the electrical components in an abuttable relationship with said first sheet.

3. The heat pipe of claim 2 wherein said planar sheets and said spacer members are aluminum.

4. The heat pipe of claim 3 wherein said working fluid is Freon-11.

5. The heat pipe of claim 3 wherein said working fluid is Freon-21.

6. The heat pipe of claim 3 additionally including a crimp at each end of said heat pipe to seal said working fluid in said pipe.

7. The heat pipe of claim 2 wherein said terminal pins extend through said spacer members.

8. The heat pipe of claim 7 wherein said electronic components are secured over said vapor channels.

9. A heat transfer structure for use with electronic equipment comprising:
   a heat pipe including a first generally planar element, a second generally planar element and a plurality of spacer members interposed between and secured to both of said planar elements effective to retain said planar elements in a spaced parallel relationship and effective to form at least one vapor channel;
   a circuit board secured to the outer surface of said second planar element;
   a plurality of terminal pins extending through said planar elements and said circuit board;
   a plurality of circuit modules abutting the outer surface of said first planar element wherein said circuit modules include a plurality of connector pins abutting said terminal pins effective to secure said modules to said first planar element.

10. The structure of claim 9 wherein said terminal pins additionally extend through said spacer members in rows parallel to said vapor channels.

11. The structure of claim 10 wherein said circuit modules are secured between said terminal pin rows over and in parallel with said vapor channels.

* * * * *